United States Patent
Huang

(10) Patent No.: US 12,494,429 B2
(45) Date of Patent: Dec. 9, 2025

(54) POWER PLANNING METHOD, CHIP DEVICE, AND NON-TRANSITORY COMPUTER READABLE MEDIUM

(71) Applicant: REALTEK SEMICONDUCTOR CORP., Hsinchu (TW)

(72) Inventor: Cheng-Chen Huang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 371 days.

(21) Appl. No.: 18/223,069

(22) Filed: Jul. 18, 2023

(65) Prior Publication Data

US 2024/0243063 A1    Jul. 18, 2024

(30) Foreign Application Priority Data

Jan. 12, 2023    (TW) .................................. 112101289

(51) Int. Cl.
*H01L 23/528* (2006.01)
*H01L 23/522* (2006.01)

(52) U.S. Cl.
CPC ...... *H01L 23/5286* (2013.01); *H01L 23/5226* (2013.01)

(58) Field of Classification Search
CPC .......................... H01L 23/5286; H01L 23/5226

USPC ........................................................ 257/773
See application file for complete search history.

(56) References Cited

U.S. PATENT DOCUMENTS

| | | |
|---|---|---|
| 7,302,662 B2 | 11/2007 | Lee et al. |
| 8,276,110 B2 | 9/2012 | Baviskar et al. |
| 9,786,977 B2 * | 10/2017 | Lyons ..................... H01P 3/082 |
| 9,977,857 B1 | 5/2018 | Ku et al. |
| 11,755,812 B2 | 9/2023 | Peng et al. |

FOREIGN PATENT DOCUMENTS

CN    110783307 A    2/2020

* cited by examiner

*Primary Examiner* — Tu-Tu V Ho
(74) *Attorney, Agent, or Firm* — Li & Cai Intellectual Property (USA) Office

(57) ABSTRACT

A power planning method, a chip device, and a non-transitory computer readable medium for the power planning method are provided. The power planning method is able to be implemented by a circuit that includes a first circuit layer and a second circuit layer. The first circuit layer includes power rails and a first standard circuit unit, and the second circuit layer includes the power rails. The power planning method includes calculating an unused routing area and a used routing area of each of the first circuit layer and the second circuit layer of the circuit; and disposing auxiliary power stripes or auxiliary via pillars to connect the power rails of the first circuit layer and the power rails of the second circuit layer.

16 Claims, 8 Drawing Sheets calculating an unused routing area and a used routing area of each of the first circuit layer and the second circuit layer of the circuit, wherein the used routing area of each of the first circuit layer and the second circuit layer has at least the plurality of power rails disposed thereon, and the unused routing area of each of the first circuit layer and the second circuit layer has none of the plurality of power rails disposed thereon — S110 calculating a plurality of voltage drop values of a plurality of power connection paths of the used routing areas — S120 sorting the plurality of voltage drop values in an order of magnitude — S130 disposing a plurality of auxiliary power stripes or a plurality of auxiliary via pillars to connect the plurality of power rails of the first circuit layer and the plurality of power rails of the second circuit layer — S140

POWER PLANNING METHOD, CHIP DEVICE, AND NON-TRANSITORY COMPUTER READABLE MEDIUM

CROSS-REFERENCE TO RELATED PATENT APPLICATION

This application claims the benefit of priority to Taiwan Patent Application No. 112101289, filed on Jan. 12, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power planning method, a chip device, and a non-transitory computer readable medium for the power planning method, and more particularly to a power planning method, a chip device, and a non-transitory computer readable medium capable of reducing voltage drop.

BACKGROUND OF THE DISCLOSURE

Power planning for a circuit usually aims to reduce negative effects of a voltage drop. In conventional approaches, more routing resources are generally provided for power planning, such as increasing the number and width of power rails or via pillars. However, in areas where severe voltage drops tend to occur, routing resources are usually less abundant, and an increased use of the power rails or the via pillars further reduces the amount of the routing resources, such that the difficulty of design is increased.

SUMMARY OF THE DISCLOSURE

In response to the above-referenced technical inadequacies, the present disclosure provides a power planning method, a chip device, and a non-transitory computer readable medium.

In one aspect, the present disclosure provides a power planning method. The power planning method is able to be applied to a circuit. The power planning method includes a first circuit layer and a second circuit layer. The second circuit layer is disposed on one side of the first circuit layer, the first circuit layer includes a plurality of power rails and at least one first standard circuit unit, and the second circuit layer includes the plurality of power rails. The power planning method includes steps as follows: calculating an unused routing area and a used routing area of each of the first circuit layer and the second circuit layer of the circuit; the used routing area of each of the first circuit layer and the second circuit layer having at least the plurality of power rails disposed thereon, and the unused routing area of each of the first circuit layer and the second circuit layer having none of the plurality of power rails disposed thereon; disposing a plurality of auxiliary power stripes or a plurality of auxiliary via pillars to connect the plurality of power rails of the first circuit layer and the plurality of power rails of the second circuit layer.

In another aspect, the present disclosure provides a chip device. The chip device includes a plurality of circuit layers. The plurality of circuit layers include at least a first circuit layer and a second circuit layer. Each of plurality of circuit layers includes an unused routing area and a used routing area, the used routing areas of the first circuit layer and the second circuit layer at least have a plurality of power rails disposed thereon, and the second circuit layer is disposed on one side of the first circuit layer. The first circuit layer includes a standard circuit unit, a plurality of power rails, a plurality of auxiliary power stripes, and a plurality of auxiliary via pillars. The plurality of power rails are electrically connected to the standard circuit unit. A plurality of power pins of the standard circuit unit are disposed on the first circuit layer. The plurality of auxiliary power stripes or the plurality of auxiliary via pillars are connected between the plurality of power rails of the first circuit layer and a plurality of power rails of the second circuit layer. The plurality of auxiliary power stripes of the first circuit layer and a plurality of auxiliary power stripes of the second circuit layer are disposed on the unused routing area to be connected to the plurality of power rails, and the plurality of power rails are not disposed on the used routing areas of the first circuit layer and the second circuit layer.

In yet another aspect, the present disclosure provides a non-transitory computer readable medium. The non-transitory computer readable medium includes a plurality of computer readable commands. When the plurality of computer readable commands are executed by a processor of a computer system, the processor executes a power planning method. The power planning method includes steps as follows: calculating an unused routing area and a used routing area of each of a first circuit layer and a second circuit layer of a circuit; the used routing area of each of the first circuit layer and the second circuit layer having at least a plurality of power rails disposed thereon, and the unused routing area of each of the first circuit layer and the second circuit layer having none of the plurality of power rails disposed thereon; disposing a plurality of auxiliary power stripes or a plurality of auxiliary via pillars to connect the plurality of power rails of the first circuit layer and the plurality of power rails of the second circuit layer.

Therefore, in the power planning method, the chip device, and the non-transitory computer readable medium provided by the present disclosure, after sufficient routing resources are used, additional power routing can be additionally disposed to improve on the issue of power drop. Furthermore, after a chip design passes a design rule checking, the reinforcements on the chip design do not need to be corrected according to another design rule checking. Furthermore, the power planning method can reduce negative effects caused by voltage drop on the via pillars and the power rails.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 1 is a schematic view of a circuit that a power planning method according to a first embodiment of the present disclosure is adapted to;

DETAILED DESCRIPTION OF THE EXEMPLARY EMBODIMENTS

Figure 1:
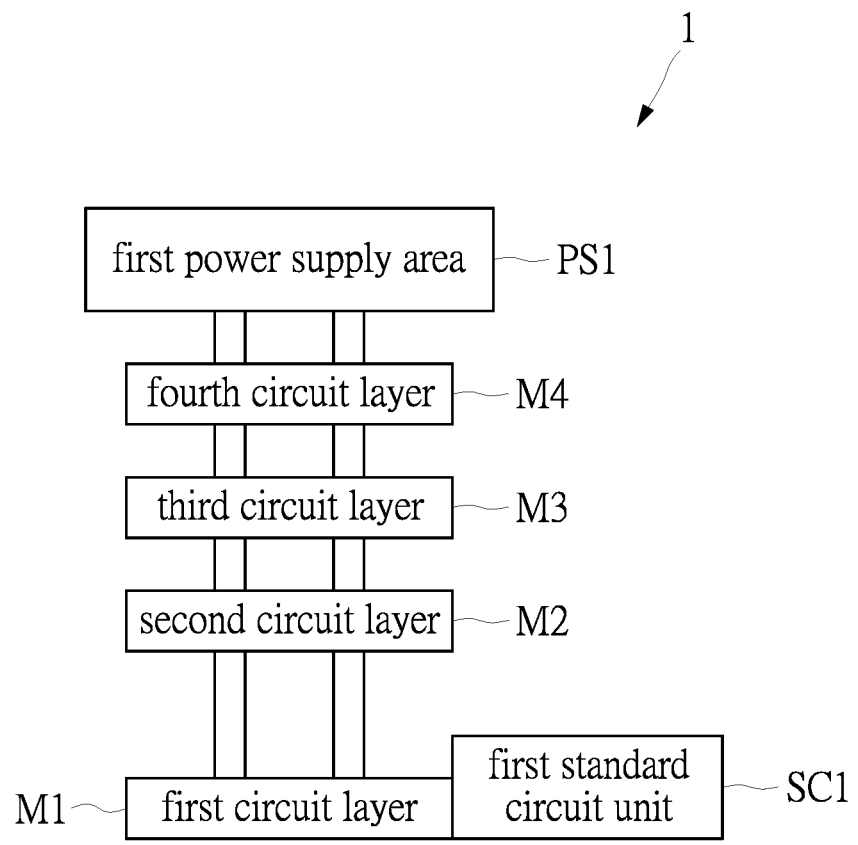

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
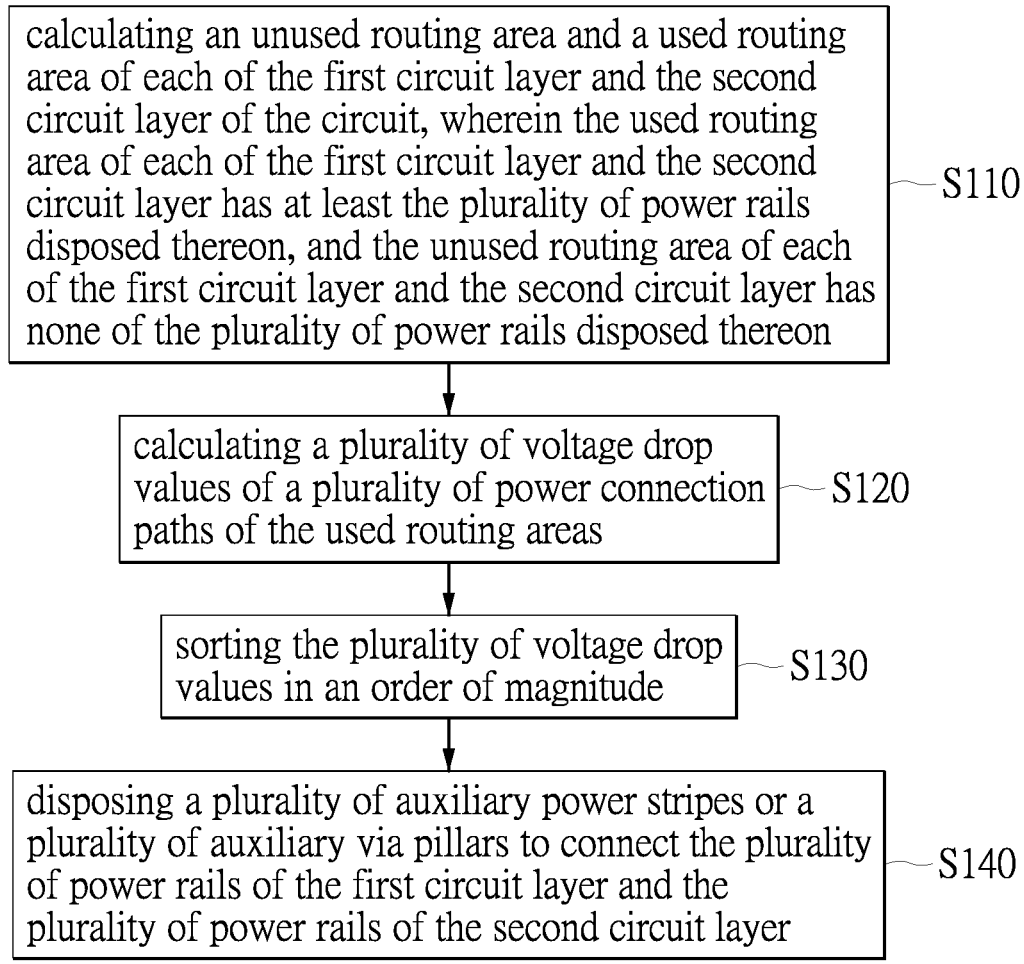
FIG. 2 is a schematic flowchart of the power planning method according to the first embodiment of the present disclosure.

Referring to FIG. 1 and FIG. 2, FIG. 1 is a schematic view of a circuit that a power planning method according to a first embodiment of the present disclosure is adapted to, and FIG. 2 is a schematic flowchart of the power planning method according to the first embodiment of the present disclosure.

In a first embodiment, a power planning method that is adapted to a circuit 1 is provided. The circuit 1 is a chip circuit.

FIG. 1 and FIG. 2 illustrate a power planning method for a chip circuit that can be applied to a chip device or implemented by other hardware components such as a database, a general processor, a computer, a server, or other unique hardware devices that have specific logic circuits or devices that have specific functions, such as integrating code and processors/chips into unique hardware. Specifically, the power planning method of this embodiment may be implemented by using a computer program to control various components in the chip device. The computer program can be stored in a non-transitory computer-readable recording medium such as a read-only memory, a flash memory, a floppy disk, a hard disk, an optical disk, a flash drive, a tape, a network-accessible database, or an equivalent computer-readable recording medium that can be easily contemplated by those skilled in the art.

The circuit 1 includes at least a first standard circuit unit SC1, a first circuit layer M1, a second circuit layer M2, a third circuit layer M3, and a fourth circuit layer M4. The first circuit layer M1, the second circuit layer M2, the third circuit layer M3, and the fourth circuit layer M4 are electrically connected in sequence. In this embodiment, the second circuit layer M2 is disposed on one side of the first circuit layer M1. The third circuit layer M3 is disposed on one side of the second circuit layer M2, and the fourth circuit layer M4 is disposed on one side of the third circuit layer M3. The first circuit layer M1, the second circuit layer M2, the third circuit layer M3, and the fourth circuit layer M4 are arranged in a stacked manner. The power pin (or ground pin) of the first standard circuit unit SC1 is disposed on the first circuit layer M1. The fourth circuit layer M4 is electrically connected to a first power supply area PS1, that is, the circuit 1 includes a plurality of circuit layers.

The number of circuit layers included in the circuit 1 can be determined according to the practical requirements, and is not limited in the present disclosure. The following description only uses the first circuit layer M1 and the second circuit layer M2 as examples, and other circuit layers are not described herein.

Referring to FIG. 2, the power planning method includes steps as follows.

Step S110: calculating an unused routing area and a used routing area of each of the first circuit layer and the second circuit layer of the circuit; the used routing area of each of the first circuit layer and the second circuit layer has at least the plurality of power rails disposed thereon, and the unused routing area of each of the first circuit layer and the second circuit layer has none of the plurality of power rails disposed thereon.

Step S120: calculating a plurality of voltage drop values of a plurality of power connection paths of the used routing areas.

Step S130: sorting the plurality of voltage drop values in an order of magnitude.

Step S140: disposing a plurality of auxiliary power stripes or a plurality of auxiliary via pillars to connect the plurality of power rails of the first circuit layer and the plurality of power rails of the second circuit layer.

Figure 3:
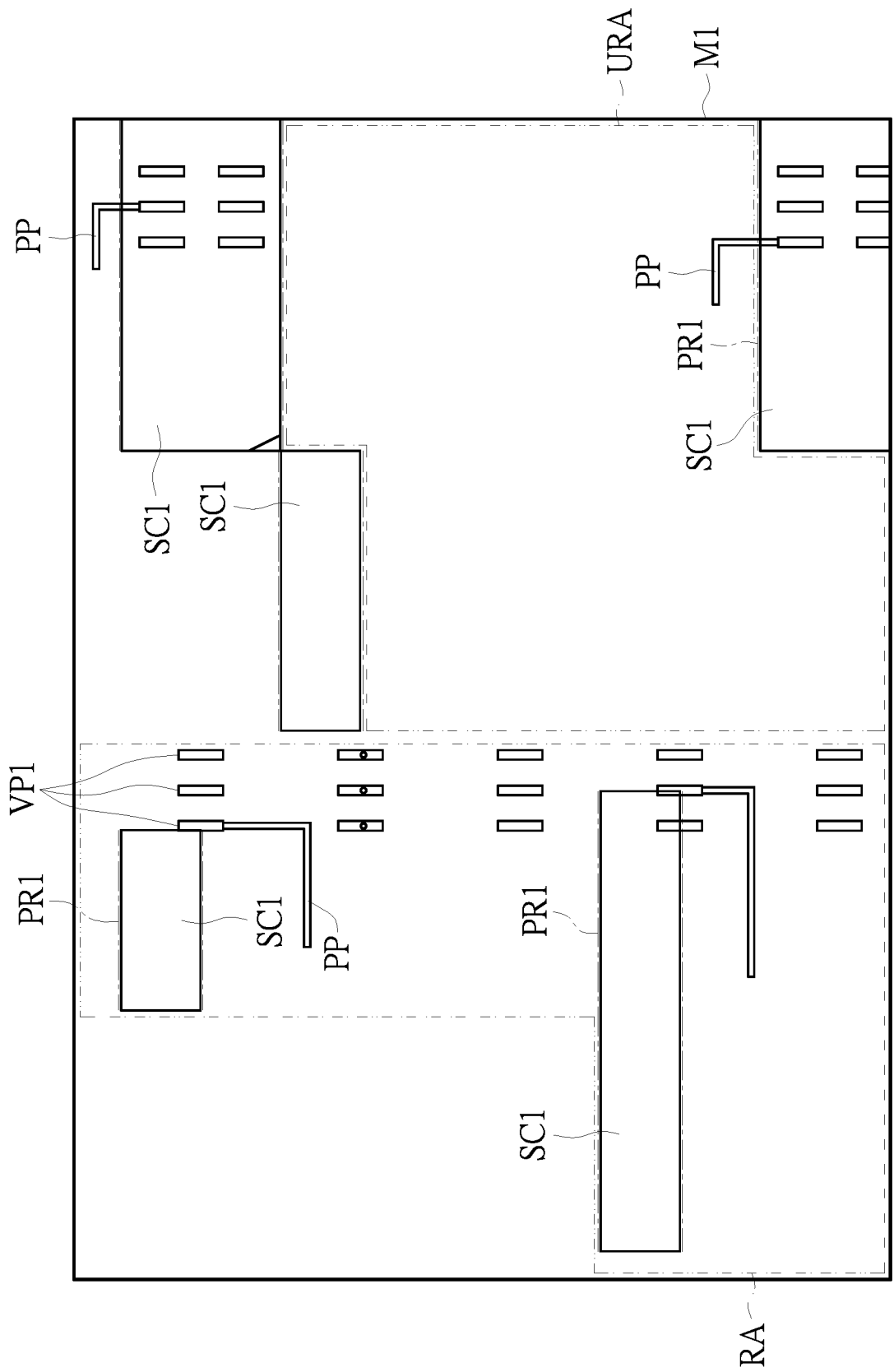
FIG. 3 is a schematic view of a first circuit layer according to the first embodiment of the present disclosure.
Figure 4:
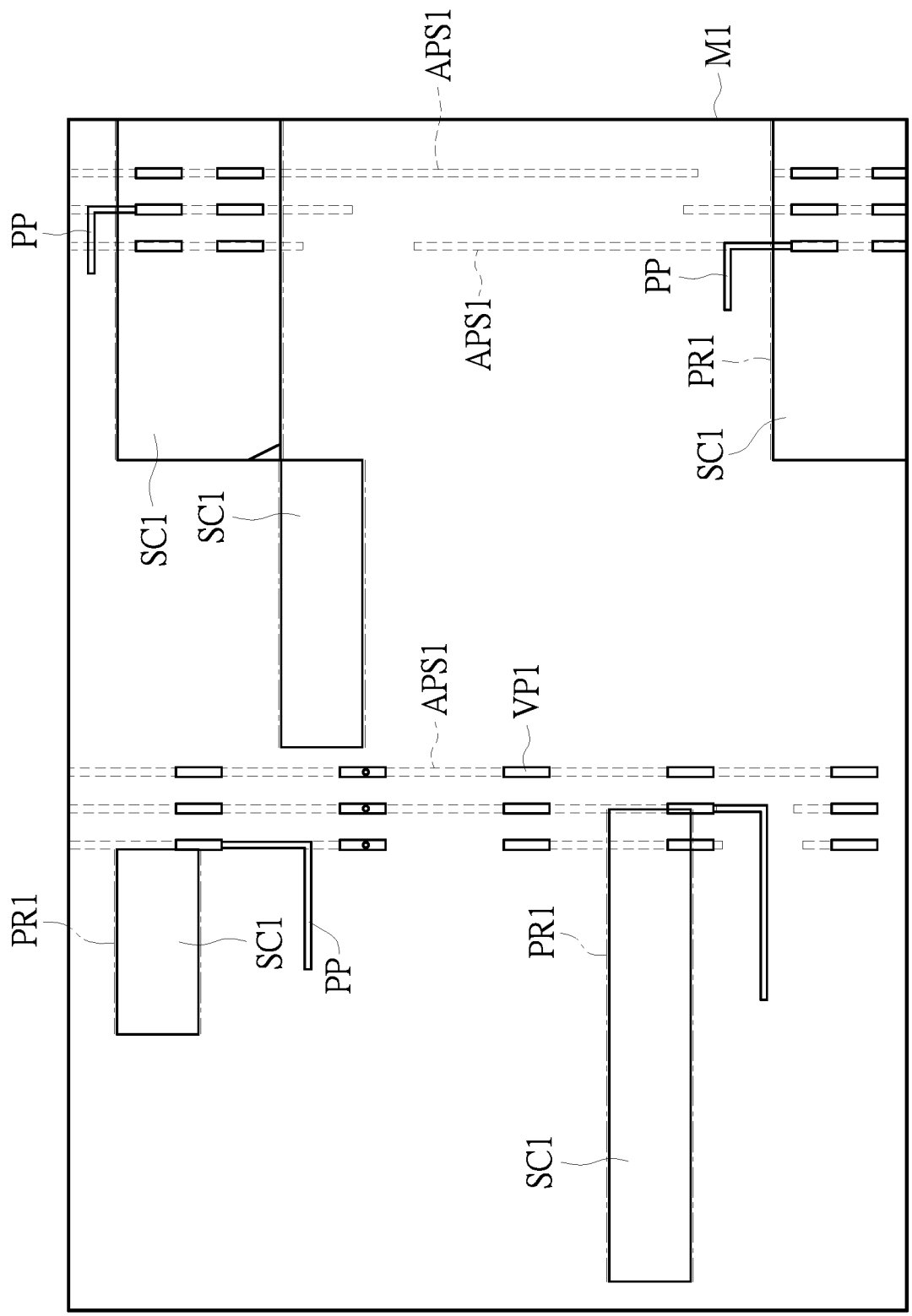
FIG. 4 is a schematic view of an auxiliary power stripe being additionally disposed on the first circuit layer based on the power planning method according to the first embodiment of the present disclosure.
Figure 5:
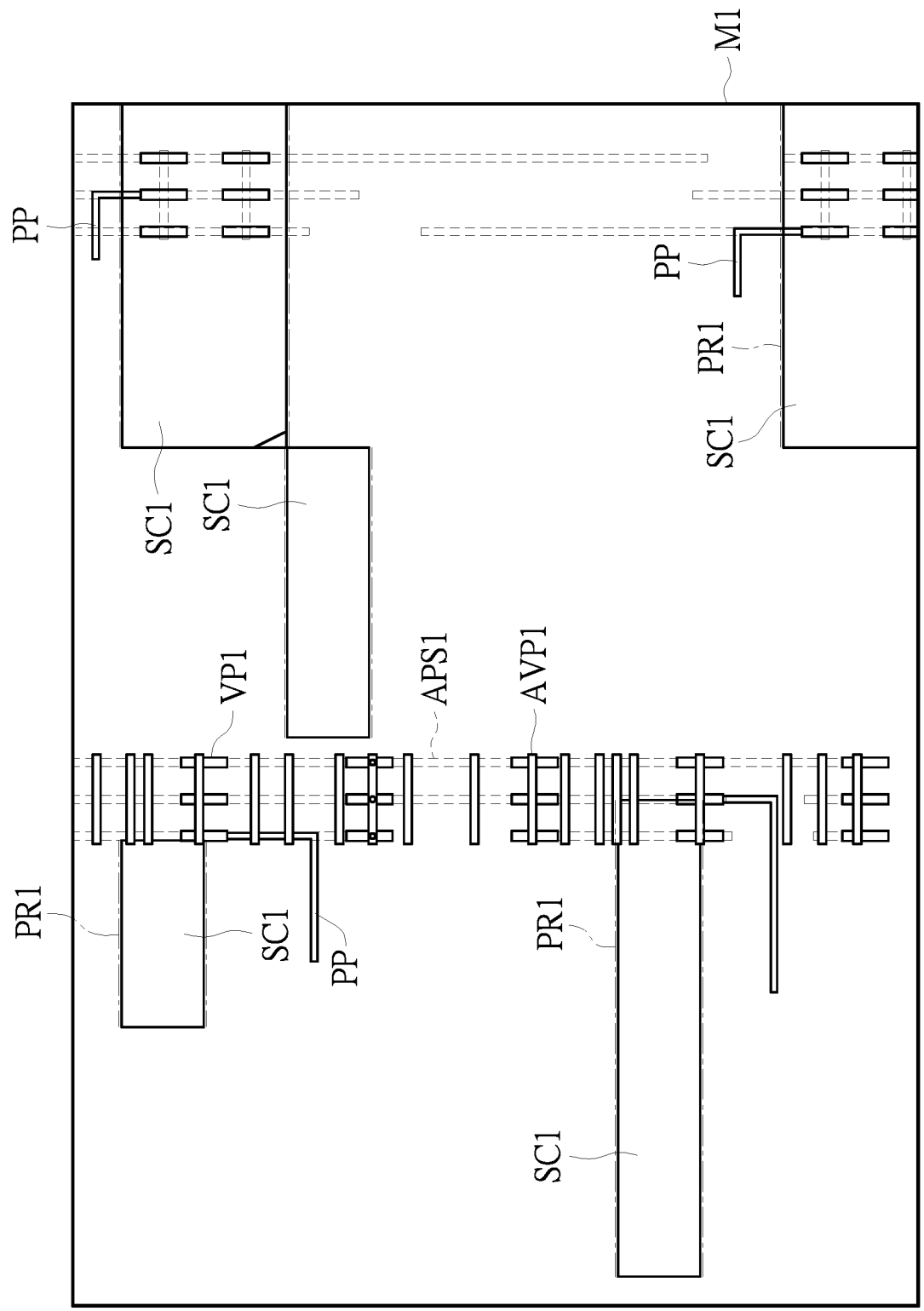
FIG. 5 is another schematic view of the auxiliary power stripe being additionally disposed on the first circuit layer based on the power planning method according to the first embodiment of the present disclosure.
Figure 6:
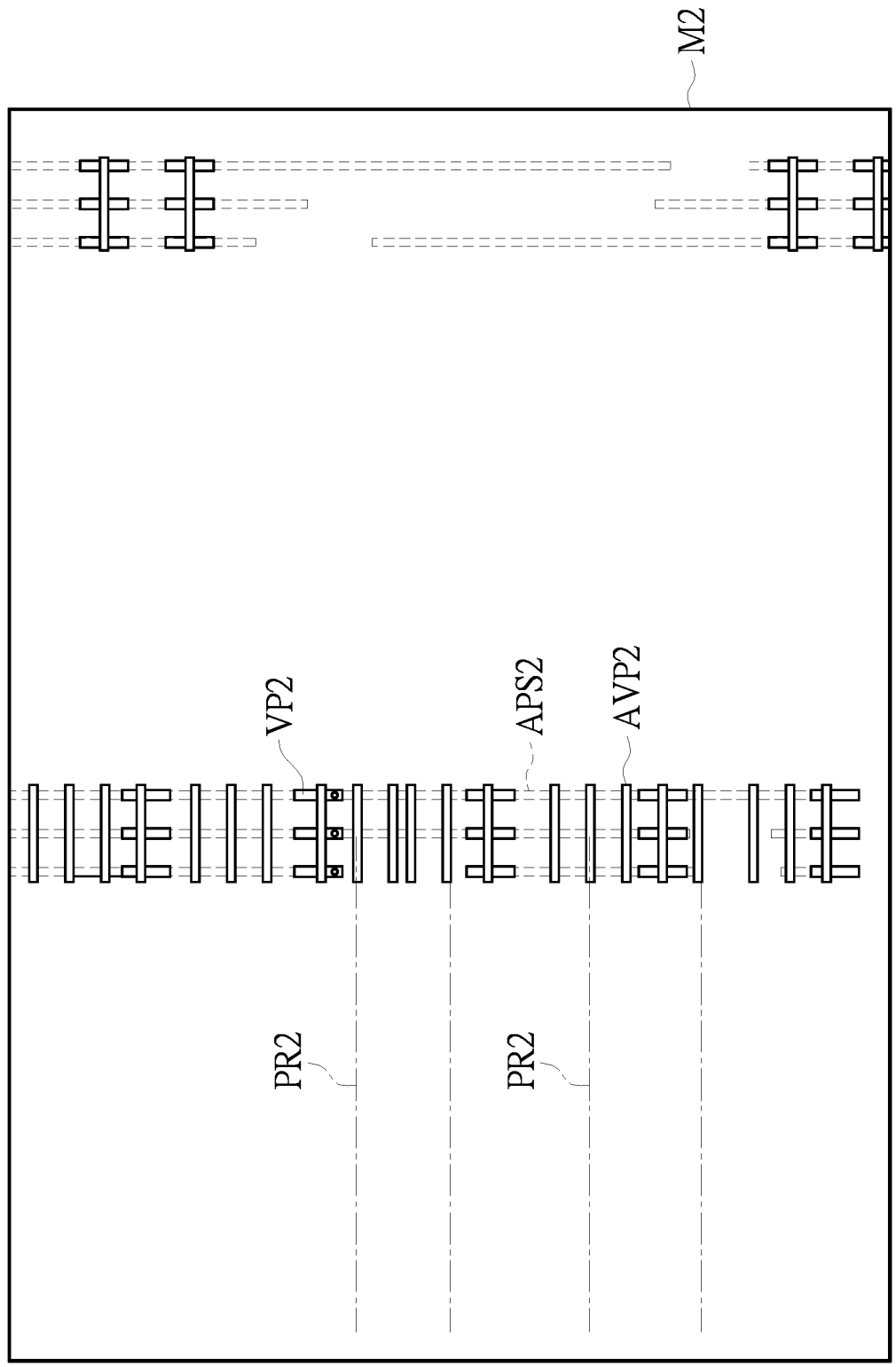
FIG. 6 is a schematic view of the auxiliary power stripe being additionally disposed on a second circuit layer based on the power planning method according to the first embodiment of the present disclosure.
Figure 7:
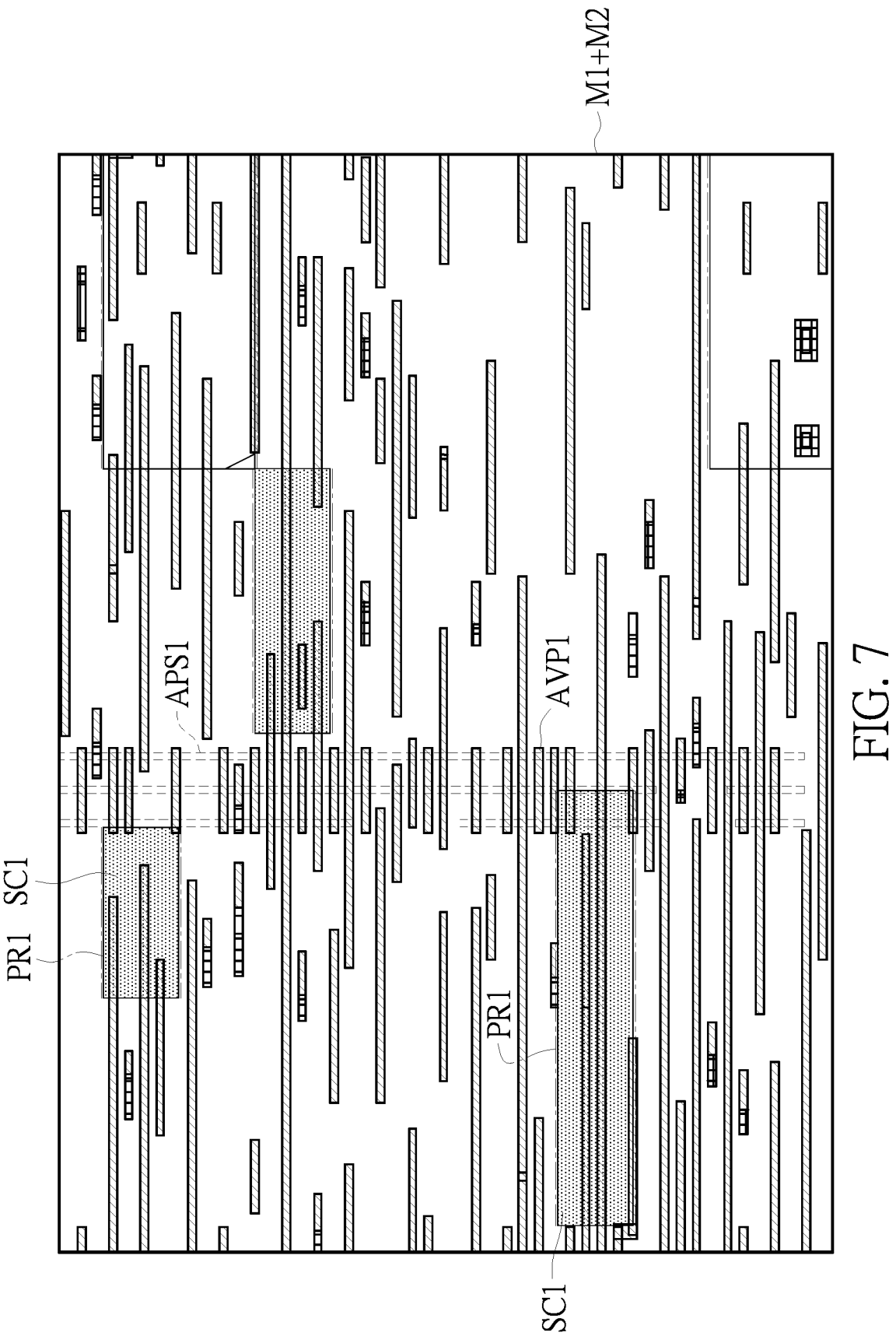
FIG. 7 is a schematic view of the auxiliary power stripe being additionally disposed on the first circuit layer and the second circuit layer based on the power planning method according to the first embodiment of the present disclosure.

Reference is made to FIG. 3, FIG. 4, FIG. 5, FIG. 6, and FIG. 7, in which FIG. 3 is a schematic view of a first circuit layer according to the first embodiment of the present disclosure, FIG. 4 is a schematic view of an auxiliary power stripe being additionally disposed on the first circuit layer based on the power planning method according to the first embodiment of the present disclosure, FIG. 5 is another schematic view of the auxiliary power stripe being additionally disposed on the first circuit layer based on the power planning method according to the first embodiment of the present disclosure, FIG. 6 is a schematic view of the auxiliary power stripe being additionally disposed on a second circuit layer based on the power planning method according to the first embodiment of the present disclosure, and FIG. 7 is a schematic view of the auxiliary power stripe being additionally disposed on the first circuit layer and the second circuit layer based on the power planning method according to the first embodiment of the present disclosure.

The circuit 1 includes a plurality of circuit layers, and the plurality of circuit layers of the circuit 1 each have a used routing area and an unused routing area. Therefore, in step S110, the unused routing area and the used routing area of each of the circuit layers of the circuit are calculated, so as to be a reference for additionally disposing the auxiliary power stripes or the auxiliary via pillars.

In FIG. 3 to FIG. 7, the first circuit layer M1, the second circuit layer M2, or a combination of the first circuit layer M1 and the second circuit layer M2 are used as examples for descriptions. Standard circuit units, power rails, auxiliary power stripes, via pillars, and auxiliary via pillars of the first circuit layer M1 are differentiated by having the term "first" added thereto. Standard circuit units, power rails, auxiliary power stripes, via pillars, and auxiliary via pillars of the second circuit layer M2 are differentiated by having the term "second" added thereto. In other circuit layers, the standard circuit units or the power rails may be omitted, so that the used routing area and unused routing area of the other circuit layers are calculated based on actual wiring areas, and are not calculated based on the power rails or the standard circuit units as shown by the first circuit layer M1 and the second circuit layer M2.

A used routing area RA of the first circuit layer M1 includes a plurality of first power rails PR1 and a plurality of first via pillars VP1, and an unused routing area URA does not include the plurality of first power rails PR1 or the plurality of first via pillars VP1. In step S110, a plurality of via pillars may also be provided as power paths between multiple circuit layers. The unused routing area URA can include an area that has multiple first standard circuit units SC1 and that is without power routing or signal routing. The power pins of the first standard circuit units SC1 are located on the first circuit layer M1. In FIG. 3, FIG. 4, and FIG. 5, the plurality of first power rails PR1 are disposed on two sides of the first standard circuit units SC1 in a transverse direction. The power pins of the first standard circuit unit SC1 are located on the first circuit layer M1 to be connected to the first power rails PR1.

Referring to FIG. 4 and FIG. 5, in this embodiment, the plurality of first auxiliary power stripes APS1 that are additionally disposed may include a plurality of first direction auxiliary power stripes and a plurality of second direction auxiliary power stripes. The first direction auxiliary power stripes are perpendicular to the second direction power stripes. That is, a first direction and a second direction are perpendicular to each other. In FIG. 5, the first auxiliary power stripes APS1 are provided between the plurality of first via pillars VP1. That is, the plurality of first via pillars VP1 are connected in the longitudinal direction. In other embodiments, the first auxiliary power stripes APS1 may also be disposed on the transverse direction.

As shown in FIG. 5, a plurality of first auxiliary via pillars AVP1 can be disposed. Similarly, in FIG. 5, the first auxiliary via pillars AVP1 are disposed on the transverse direction, in other embodiments, the first auxiliary via pillars AVP1 are disposed on the longitudinal direction.

Referring to FIG. 6, as mentioned above, the second circuit layer M2 is disposed on one side of the first circuit layer M1. The second circuit layer M2 includes at least a plurality of second power rails PR2. In this embodiment, the second circuit layer M2 can further include a plurality of second via pillars VP2, that is, the second circuit layer M2 can have only the second power rails PR2 disposed thereon, or the second circuit layer M2 can also have a plurality of second standard circuit units (not shown in the figure) disposed thereon, and it is not limited in the present disclosure.

In step S120 and step S130, the voltage drop value of each power connection path PP is first calculated. Since the first circuit layer M1 includes multiple ones of the first standard circuit unit SC1, each of the first standard circuit units SC1 is connected to at least one power connection path PP to receive electrical energy. The power connection path PP is connected from the first power supply area PS1 to the first standard circuit unit SC1. The voltage drop value of each power connection path PP can be calculated based on an input voltage and the impedance values of the first power rail PR1 and the first via pillar VP1 on the power connection path PP. That is, each power connection path PP is connected to at least one of the plurality of first standard circuit units SC1, one of the plurality of first power rails PR1, and the first power supply area PS1 of the first circuit layer M1.

Then, in step S130, the voltage drop values of the plurality of power connection paths PP are sorted in an order of magnitude.

In step S140, according to the unused routing area and the order of magnitude of the plurality of voltage drop values, the plurality of first auxiliary power stripes APS1 or the plurality of first auxiliary via pillars AVP1 are disposed to connect the plurality of first power rails PR1. In FIG. 6, a plurality of second auxiliary power stripes APS2 and a plurality of second auxiliary via pillars AVP2 are disposed. In this embodiment, after the auxiliary power stripes and the auxiliary via pillars are additionally disposed, the plurality of voltage drop values of the plurality of power connection paths are calculated again to determine whether or not to additionally dispose the auxiliary power stripes or the auxiliary via pillars.

That is, in this embodiment, a power connection path PP having the more severe voltage drop is the first to be reinforced by using auxiliary power stripes or auxiliary via pillars. The plurality of first auxiliary power stripes APS1 in FIG. 4 can be disposed on gaps of the unused routing area URA and on gaps of the used routing area RA. In addition, the area of each of the power connection paths having the more severe voltage drop or having a greater magnitude of the power drop value can be considered as a voltage drop area (i.e., a weak region). In this embodiment, the plurality of auxiliary power stripes or the plurality of auxiliary via pillars can be additionally disposed directly to the voltage drop area to compensate for the voltage drop in the voltage drop area.

In addition, each power connection path may include one or more voltage drop areas. As described in step S140 of sorting the plurality of voltage drop values of the plurality of power connection paths in an order of magnitude, in this embodiment, the plurality of auxiliary power stripes and the plurality of auxiliary via pillars are additionally disposed according to the order of magnitude of the voltage drop values starting from the power connection path having the most severe voltage drop. Next, the plurality of auxiliary power stripes and the plurality of auxiliary via pillars are additionally disposed to the power connection path having less severe voltage drop, so that voltage drop phenomenon can be reduced in the plurality of power connection paths having voltage drop. In other words, the power planning method in this embodiment sequentially disposes a plurality of auxiliary power stripes and a plurality of auxiliary via pillars to the unused routing area URA adjacent to the power connection path having the more severe voltage drop according to an order of magnitude of voltage drop values.

Referring to FIG. 6, similarly, the plurality of second power rail PR2 are also arranged in a transverse manner.

The plurality of second auxiliary power stripes APS2 can also be disposed on the first direction and the second direction. The first direction and the second direction are perpendicular to each other.

Referring to FIG. 4 and FIG. 6, since the plurality of first auxiliary power stripes APS1 and second auxiliary power stripes APS2 are disposed, the plurality of voltage drop values of the plurality of power connection paths PP connected to the used routing area RA of the first circuit layer M1 in the multiple circuit layers of the circuit 1 can be calculated again.

In addition, according to the power planning method in this embodiment, auxiliary power stripes and auxiliary via pillars can be additionally disposed on the unused routing area (not shown in the figures) of the third circuit layer M3 and the fourth circuit layer M4 of each circuit layer of the circuit 1 to reduce the power drop value. That is, the plurality of auxiliary power stripes or the plurality of auxiliary via pillars can be disposed on the unused routing area of the third circuit layer M3 and the fourth circuit layer M4 to be connected to the plurality of auxiliary power stripes, the plurality of auxiliary via pillars, or the plurality of power rails of the second circuit layer M2 or the first circuit layer M1.

Referring to FIG. 7, FIG. 7 is a schematic view of the auxiliary power stripe being additionally disposed on the first circuit layer M1 and the second circuit layer M2 based on the power planning method according to the first embodiment of the present disclosure. In this embodiment, the auxiliary power stripes are disposed on the multiple circuit layers. That is, the auxiliary power stripes or the auxiliary via pillars are three-dimensional power paths that can be additional power paths connected to the standard circuit units in addition to the existing power rails and signal wirings that are connected to the standard circuit units, thereby reducing a power drop value.

Second Embodiment

Figure 8:
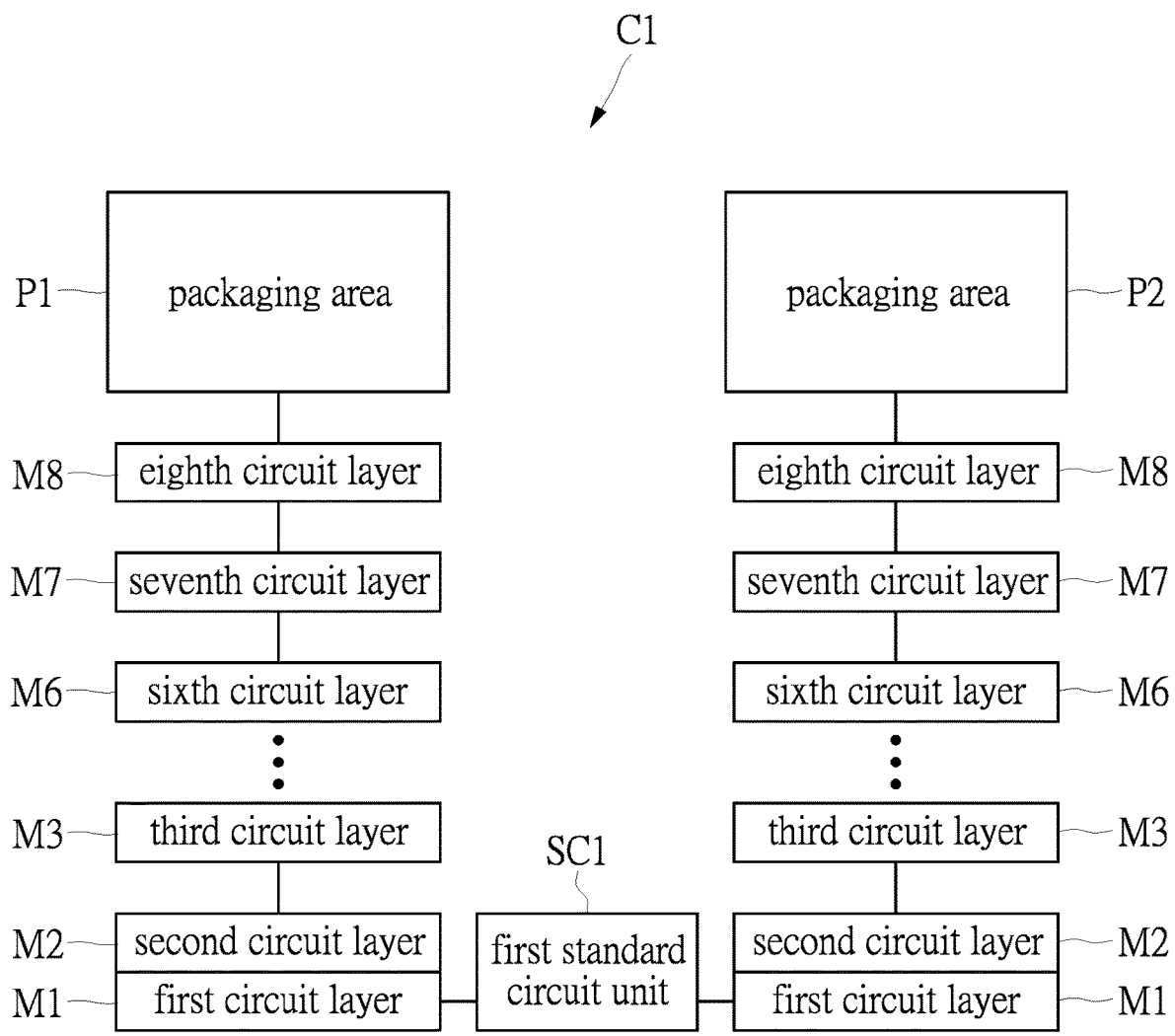
FIG. 8 is a schematic view of a chip device according to a second embodiment of the present disclosure.

Referring to FIG. 8, FIG. 8 is a schematic view of a chip device according to a second embodiment of the present disclosure.

In this embodiment, the present disclosure provides a chip device C1 that is a chip circuit that adopts the aforementioned power planning method of the first embodiment.

The chip device C1 includes a plurality of circuit layers from a first circuit layer M1 to an eighth circuit layer M8, and the first circuit layer M1 includes a first standard circuit unit SC1, a plurality of power rails (not shown in the figure), and a plurality of auxiliary power stripes (not shown in the figure). The plurality of power rails (not shown in the figure) and the plurality of auxiliary power stripes (not shown in the figure) can be referred to in the first power rails PR1, the second power rails PR2, the first auxiliary power stripes APS1, and the second auxiliary power stripes APS2 as shown in FIG. 1 to FIG. 7. Furthermore, the first standard circuit unit SC1 is connected to a packaging area through the first circuit layer M1 to the eighth circuit layer M8 that are located at two sides of the first standard circuit unit SC1. The first circuit layer M1 to the eighth circuit layer M8 are electrically connected to each other through a plurality of power paths and signal paths.

Each of the first circuit layer M1 to the eighth circuit layer M8 includes an unused routing area and a used routing area. The plurality of power rails (not shown in the figure) of the first circuit layer M1 is electrically connected to the first standard circuit unit SC1. In this embodiment, the first circuit layer M1 includes an unused routing area (not shown in the figure) and a used routing area (not shown in the figure). The used routing area includes at least the plurality of power rails disposed thereon, and the unused routing area (not shown in the figure) has none of the plurality of power rails disposed thereon. In practice, the position on which the first standard circuit unit is located also includes an area without power path or signal path, and in this embodiment, the area is included in the unused routing area (not shown in the figure). That is, in addition to the power rails, the auxiliary power stripes are disposed in the unused routing area (not shown in the figure), so as to be connected between the power rails and the standard circuit unit.

In this embodiment, the power rail (not shown), the auxiliary power stripe (not shown), and the auxiliary via pillar (not shown) can be implemented by referring to the power planning method of the first embodiment. Furthermore, a main disposing area of the power rails (not shown in the figure) is in the first circuit layer M1 and the second circuit layer M2, and the used routing areas and the unused routing areas of the third circuit layer M3 to the eighth circuit layer M8 above the second circuit layer M2 are calculated based on actual wiring areas of the third circuit layer M3 to the eighth circuit layer M8. In addition, the auxiliary power stripes (not shown in the figure) and the auxiliary via pillars (not shown in the figure) of this embodiment can be disposed in different ones of the first circuit layer M1 to the eighth circuit layer M8; furthermore, they are not limited to be disposed only in the first circuit layer M1 and the second circuit layer M2, and can be disposed in the third circuit layer M3 to the eighth circuit layer M8, in order to reduce the power drop value of the power path.

Beneficial Effects of the Embodiments

In conclusion, in the power planning method, the chip device, and the non-transitory computer readable medium provided by the present disclosure, after sufficient routing resources are used, additional power routing can be additionally disposed to improve on the issue of power drop. Furthermore, after a chip design passes a design rule checking, the reinforcements on the chip design do not need to be corrected according to another design rule checking. Furthermore, the power planning method can reduce negative effects caused by voltage drop on the via pillars and the power rails.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power planning method, capable of being implemented by a circuit that includes a first circuit layer and a second circuit layer, wherein the second circuit layer is disposed on one side of the first circuit layer, the first circuit layer includes a plurality of power rails and at least one first standard circuit unit, and the second circuit layer includes the plurality of power rails, wherein the power planning method comprises:
calculating an unused routing area and a used routing area of each of the first circuit layer and the second circuit layer of the circuit, wherein the used routing area of each of the first circuit layer and the second circuit layer has at least the plurality of power rails disposed thereon, and the unused routing area of each of the first circuit layer and the second circuit layer has none of the plurality of power rails disposed thereon; and
disposing a plurality of auxiliary power stripes or a plurality of auxiliary via pillars to connect the plurality of power rails of the first circuit layer and the plurality of power rails of the second circuit layer.

2. The power planning method according to claim 1, wherein, after calculating the unused routing area and the used routing area of each of the first circuit layer and the second circuit layer of the circuit, the power planning method further comprises:
calculating a plurality of voltage drop values of a plurality of power connection paths of the used routing areas; and
sorting the plurality of voltage drop values in an order of magnitude.

3. The power planning method according to claim 2, wherein according to the unused routing area and the order of magnitude of the plurality of voltage drop values, the plurality of auxiliary power stripes or the plurality of auxiliary via pillars are additionally disposed to connect the plurality of power rails.

4. The power planning method according to claim 3, wherein, after the plurality of auxiliary power stripes and the plurality of auxiliary via pillars are additionally disposed, the plurality of voltage drop values of the plurality of power connection paths are calculated again.

5. The power planning method according to claim 3, wherein the plurality of auxiliary power stripes include a plurality of first direction auxiliary power stripes that are disposed on a first direction and a plurality of second direction auxiliary power stripes that are disposed on a second direction, and the first direction and the second direction are perpendicular to each other.

6. The power planning method according to claim 5, wherein the circuit further includes a third circuit layer, the third circuit layer is disposed on one side of the second circuit layer, and the first circuit layer, the second circuit layer, and the third circuit layer are arranged in a stacked manner;
wherein the third circuit layer has a plurality of auxiliary power stripes or a plurality of auxiliary via pillars disposed thereon for connecting the plurality of auxiliary power stripes, the plurality of auxiliary via pillars, or the plurality of power rails of the first circuit layer or the second circuit layer.

7. The power planning method according to claim 6, wherein each of the plurality of power connection paths is at least connected to the first standard circuit unit of the first circuit layer, one of the plurality of power rails, and a power supply area.

8. The power planning method according to claim 3, wherein an area having a largest one of the voltage drop values is a voltage drop area, and the power planning method further comprises: additionally disposing the plurality of auxiliary power stripes or the plurality of auxiliary via pillars on the unused routing area that is adjacent to the voltage drop area.

9. The power planning method according to claim 3, wherein the plurality of auxiliary power stripes or the plurality of auxiliary via pillars are disposed on the unused routing area that is adjacent to the plurality of power connection paths according to the order of magnitude of the plurality of voltage drop values of the plurality of power connection paths.

10. A chip device, comprising:
a plurality of circuit layers that include at least a first circuit layer and a second circuit layer, wherein each of plurality of circuit layers includes an unused routing area and a used routing area, the used routing areas of the first circuit layer and the second circuit layer at least have a plurality of power rails disposed thereon, and the second circuit layer is disposed on one side of the first circuit layer, wherein the first circuit layer includes:
a standard circuit unit;
a plurality of power rails electrically connected to the standard circuit unit, wherein a plurality of power pins of the standard circuit unit are disposed on the first circuit layer; and
a plurality of auxiliary power stripes or a plurality of auxiliary via pillars, wherein the plurality of auxiliary power stripes or the plurality of auxiliary via pillars are connected between the plurality of power rails of the first circuit layer and a plurality of power rails of the second circuit layer, wherein the plurality of auxiliary power stripes of the first circuit layer and a plurality of auxiliary power stripes of the second circuit layer are disposed on the unused routing area to be connected to the plurality of power rails, and the plurality of power rails are not disposed on the used routing areas of the first circuit layer and the second circuit layer.

11. The chip device according to claim 10, wherein according to the unused routing area and an order of magnitude of the plurality of voltage drop values the plurality of auxiliary power stripes or the plurality of auxiliary via pillars are additionally disposed to connect the plurality of power rails.

12. The chip device according to claim 11, wherein the plurality of circuit layers of the chip device further include a third circuit layer, the third circuit layer is disposed on one side of the second circuit layer, and the first circuit layer, the second circuit layer, and the third circuit layer are arranged in a stacked manner; wherein the third circuit layer has a plurality of auxiliary power stripes or a plurality of auxiliary via pillars disposed thereon for connecting the plurality of auxiliary power stripes, the plurality of auxiliary via pillars, or the plurality of power rails of the second circuit layer or the first circuit layer.

13. The chip device according to claim 11, wherein an area having a largest one of the voltage drop values is a voltage drop area, and the plurality of auxiliary power stripes or the plurality of auxiliary via pillars are additionally disposed on the unused routing area that is adjacent to the voltage drop area.

14. The chip device according to claim 11, wherein the plurality of auxiliary power stripes or the plurality of auxiliary via pillars are disposed on the unused routing area that is adjacent to the plurality of power connection paths according to the order of magnitude of the plurality of voltage drop values of the plurality of power connection paths.

15. A non-transitory computer readable medium, comprising a plurality of computer readable commands, wherein, when the plurality of computer readable commands are executed by a processor of a computer system, the processor executes a power planning method, wherein the power planning method includes:

calculating an unused routing area and a used routing area of each of a first circuit layer and a second circuit layer of a circuit, wherein the used routing area of each of the first circuit layer and the second circuit layer has at least a plurality of power rails disposed thereon, and the unused routing area of each of the first circuit layer and the second circuit layer has none of the plurality of power rails disposed thereon; and disposing a plurality of auxiliary power stripes or a plurality of auxiliary via pillars to connect the plurality of power rails of the first circuit layer and the plurality of power rails of the second circuit layer.

16. The non-transitory computer readable medium according to claim 15, wherein, in the power planning method, after calculating the unused routing area and the used routing area of each of the first circuit layer and the second circuit layer, the power planning method further includes:

calculating a plurality of voltage drop values of a plurality of power connection paths of the used routing areas; and sorting the plurality of voltage drop values in an order of magnitude, and according to the unused routing area of each of the first circuit layer and the second circuit layer, and the order of magnitude of the plurality of voltage drop values, disposing the plurality of auxiliary power stripes or the plurality of via pillars to connect the plurality of power rails of the first circuit layer and the plurality of power rails of the second circuit layer.

* * * * *